(12) United States Patent
Liu et al.

(10) Patent No.: US 11,397,495 B2
(45) Date of Patent: Jul. 26, 2022

(54) FINGERPRINT IDENTIFICATION MODULE AND DRIVING METHOD THEREOF AND ELECTRONIC DEVICE

(71) Applicant: BOE Technology Group Co., Ltd., Beijing (CN)

(72) Inventors: Yingming Liu, Beijing (CN); Xiaoliang Ding, Beijing (CN); Xiufeng Li, Beijing (CN); Pengpeng Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 56 days.

(21) Appl. No.: 16/771,140

(22) PCT Filed: Jan. 17, 2020

(86) PCT No.: PCT/CN2020/072806
§ 371 (c)(1),
(2) Date: Jun. 9, 2020

(87) PCT Pub. No.: WO2020/156249
PCT Pub. Date: Aug. 6, 2020

(65) Prior Publication Data
US 2021/0209334 A1    Jul. 8, 2021

(30) Foreign Application Priority Data

Jan. 28, 2019   (CN) ........................ 201910082585.9
Sep. 12, 2019   (WO) ............... PCT/CN2019/105749

(51) Int. Cl.
*G06K 9/00*       (2006.01)
*G06F 3/043*      (2006.01)
(Continued)

(52) U.S. Cl.
CPC .......... *G06F 3/0436* (2013.01); *G06F 3/0433* (2013.01); *G06F 3/0445* (2019.05);
(Continued)

(58) Field of Classification Search
CPC .. G06F 3/0436; G06F 3/04164; G06F 3/0433; G06F 3/0445; G06F 2203/04103;
(Continued)

(56) References Cited

U.S. PATENT DOCUMENTS 9,830,855 B1    11/2017   Li
2008/0084457 A1*  4/2008  Hibi ..................... B41J 2/04588
                                                                347/70
(Continued)

FOREIGN PATENT DOCUMENTS

CN   103927468 A   7/2014
CN   104809431 A   7/2015
(Continued)

OTHER PUBLICATIONS

Feb. 7, 2022—U.S. Office Action U.S. Appl. No. 16/642,804.
(Continued)

*Primary Examiner* — Jonathan A Boyd
(74) *Attorney, Agent, or Firm* — Banner & Witcoff, Ltd.

(57) ABSTRACT

A fingerprint identification module and a driving method thereof and an electronic device are provided. In the fingerprint identification module, a receiving electrode layer includes a plurality of receiving electrodes; a first driving electrode layer is arranged at a side of a piezoelectric material layer away from the receiving electrode layer and includes a plurality of first driving electrodes; a second driving electrode layer is arranged at a side of the receiving electrode layer away from the piezoelectric material layer and includes a plurality of second driving electrodes; the plurality of first driving electrodes and the plurality of
(Continued)

second driving electrodes form a plurality of driving electrode pairs, and in each driving electrode pair, an orthographic projection of the first driving electrode on the piezoelectric material layer is at least partially overlapped with an orthographic projection of the second driving electrode on the piezoelectric material layer.

18 Claims, 4 Drawing Sheets

(51) Int. Cl.
*H01L 41/04* (2006.01)
*H01L 41/047* (2006.01)
*H01L 41/083* (2006.01)
*H01L 41/113* (2006.01)
*H01L 41/27* (2013.01)
*G06F 3/044* (2006.01)
*G06F 3/041* (2006.01)
*G06V 40/13* (2022.01)
*G06V 40/12* (2022.01)

(52) U.S. Cl.
CPC ...... *G06F 3/04164* (2019.05); *G06V 40/1306* (2022.01); *G06V 40/1365* (2022.01); *H01L 41/042* (2013.01); *H01L 41/0477* (2013.01); *H01L 41/083* (2013.01); *H01L 41/1132* (2013.01); *H01L 41/27* (2013.01); *G06F 2203/04103* (2013.01)

(58) Field of Classification Search
CPC .. G06K 9/0002; G06K 9/00087; G06K 9/209; H01L 41/042; H01L 41/0477; H01L 41/083; H01L 41/1132; H01L 41/27
See application file for complete search history.

(56) References Cited

U.S. PATENT DOCUMENTS

| | | | |
|---|---|---|---|
| 2009/0236940 A1 | 9/2009 | Nakayama et al. | |
| 2013/0249860 A1 | 9/2013 | Seo et al. | |
| 2016/0124560 A1* | 5/2016 | Watazu | H01L 41/0478 345/173 |
| 2016/0163958 A1 | 6/2016 | Park et al. | |
| 2016/0364063 A1* | 12/2016 | Wang | G06F 1/3262 |
| 2017/0061839 A1 | 3/2017 | Park et al. | |
| 2019/0102045 A1 | 4/2019 | Miranto et al. | |

FOREIGN PATENT DOCUMENTS

| | | | |
|---|---|---|---|
| CN | 105335694 A | 2/2016 | |
| CN | 106250834 A | 12/2016 | |
| CN | 106782085 A | 5/2017 | |
| CN | 106896955 A | 6/2017 | |
| CN | 106951130 A | 7/2017 | |
| CN | 107122080 A | 9/2017 | |
| CN | 107220630 A | 9/2017 | |
| CN | 107609539 A | 1/2018 | |
| CN | 107798300 A | 3/2018 | |
| CN | 207182329 U | 4/2018 | |
| CN | 108363993 A | 8/2018 | |
| CN | 108446685 * | 8/2018 | ............ G06K 9/00 |
| CN | 108446685 A | 8/2018 | |
| CN | 108598117 A | 9/2018 | |
| CN | 108664913 A | 10/2018 | |
| CN | 108776797 A | 11/2018 | |
| CN | 108845323 A | 11/2018 | |
| CN | 108877516 A | 11/2018 | |
| CN | 108921074 A | 11/2018 | |
| CN | 208126414 U | 11/2018 | |
| CN | 109145859 A | 1/2019 | |
| CN | 109219817 A | 1/2019 | |
| CN | 109584770 A | 4/2019 | |
| CN | 109829419 A | 5/2019 | |

OTHER PUBLICATIONS

Apr. 26, 2020—CN International Search Report Appn PCT/CN2020/072849.
Aug. 4, 2020—CN Office Action Appn 201910082585.9 with English Translation.
May 28, 2021—CN First Office Action Appn 201980001692.2 with English Translation.
Feb. 4, 2022—IN Office Action Appn 202017056360.

* cited by examiner

FINGERPRINT IDENTIFICATION MODULE AND DRIVING METHOD THEREOF AND ELECTRONIC DEVICE

This application is a U.S. National Phase Entry of International Application No. PCT/CN2020/072806 filed on Jan. 17, 2020, designating the United States of America and claiming priority to Chinese Patent Application No. 201910082585.9 filed on Jan. 28, 2019; and International Patent Application No. PCT/CN2019/105749 filed on Sep. 12, 2019. The present application claims priority to and the benefit of the above-identified applications and the above-identified applications are incorporated by reference herein in their entirety.

TECHNICAL FIELD

Embodiments of the present disclosure relate to a fingerprint identification module and a driving method thereof, and an electronic device.

BACKGROUND

With the continuous development of science and technology, fingerprint identification technology has been gradually applied to people's daily lives. Fingerprint identification technology can be used for identification by comparing the detailed feature points of different fingerprints, so as to achieve the function of identity recognition. Generally, fingerprint identification technology can be divided into optical fingerprint identification technology, silicon chip fingerprint identification technology, and ultrasonic fingerprint identification technology.

At present, ultrasonic fingerprint identification technology is a popular research direction of major manufacturers. The ultrasonic fingerprint identification structure mainly includes a three-layered structure, which includes a first driving electrode, a receiving electrode, and a piezoelectric layer between the first driving electrode and receiving electrode. When a driving voltage is applied to the first driving electrode and the receiving electrode, the piezoelectric layer is excited by the driving voltage to generate a reverse piezoelectric effect, so as to transmit a first ultrasonic wave. Upon contacting with the finger, the first ultrasonic wave is reflected by the finger to generate a second ultrasonic wave. Because the fingerprint includes valleys and ridges, vibration intensities of the second ultrasonic wave reflected by the fingerprint back to the piezoelectric layer are different. At this time, the first driving electrode is loaded with a constant voltage, and the piezoelectric layer can convert the second ultrasonic wave into a voltage signal that is transmitted to the fingerprint identification module through the receiving electrode, and the positions of valleys and ridges in the fingerprint are determined according to the voltage signal.

SUMMARY

At least one embodiment of the present disclosure provides a fingerprint identification module and a driving method thereof and an electronic device. The fingerprint identification module includes: a receiving electrode layer, a piezoelectric material layer, a first driving electrode layer, and a second driving electrode layer. The receiving electrode layer includes a plurality of receiving electrodes; the piezoelectric material layer is arranged at a side of the receiving electrode layer; the first driving electrode layer is arranged at a side of the piezoelectric material layer away from the receiving electrode layer and includes a plurality of first driving electrodes; the second driving electrode layer is arranged at a side of the receiving electrode layer away from the piezoelectric material layer and includes a plurality of second driving electrodes; the plurality of first driving electrodes and the plurality of second driving electrodes form a plurality of driving electrode pairs, and in each of the plurality of driving electrode pairs, an orthographic projection of the first driving electrode on the piezoelectric material layer is at least partially overlapped with an orthographic projection of the second driving electrode on the piezoelectric material layer. With this arrangement, the first driving electrode and the second driving electrode in each of the plurality of driving electrode pair together with the piezoelectric material layer can constitute an ultrasonic transmitting element, so that ultrasonic transmission can be realized. On the one hand, the fingerprint identification module can achieve high-voltage drive or high-voltage excitation of the piezoelectric material layer, the fingerprint identification module can greatly reduce the risk of breakdown of electronic components (such as thin film transistors) in the driving unit due to high voltage, thereby improving the stability and durability of the product, and on the other hand, the fingerprint identification module can simultaneously realize high-voltage drive or high-voltage excitation of the piezoelectric material layer and ultrasonic focusing technology, thereby facilitating to improve fingerprint identification performance and realize a large-sized fingerprint identification module.

At least one embodiment of the present disclosure provides a fingerprint identification module, which includes: a receiving electrode layer including a plurality of receiving electrodes; a piezoelectric material layer arranged at a side of the receiving electrode layer; a first driving electrode layer arranged at a side of the piezoelectric material layer away from the receiving electrode layer and including a plurality of first driving electrodes; and a second driving electrode layer arranged at a side of the receiving electrode layer away from the piezoelectric material layer and including a plurality of second driving electrodes; the plurality of first driving electrodes and the plurality of second driving electrodes form a plurality of driving electrode pairs, and in each of the plurality of driving electrode pairs, an orthographic projection of the first driving electrode on the piezoelectric material layer is at least partially overlapped with an orthographic projection of the second driving electrode on the piezoelectric material layer.

For example, in the fingerprint identification module provided by an embodiment of the present disclosure, the plurality of receiving electrodes are arranged in an array in a first direction and a second direction, and the plurality of first driving electrodes are arranged in the second direction, the plurality of second driving electrodes are arranged in the second direction, each of the plurality of first driving electrodes and each of the plurality of second driving electrodes are strip electrodes extending in the first direction, and the first direction intersects with the second direction.

For example, in the fingerprint identification module provided by an embodiment of the present disclosure, orthographic projections of each of the plurality of first driving electrodes and each of the plurality of second driving electrodes on the piezoelectric material layer are at least partially overlapped with an orthographic projection of multiple receiving electrodes arranged in the first direction on the piezoelectric material layer.

For example, in the fingerprint identification module provided by an embodiment of the present disclosure, the fingerprint identification module further includes: a driving circuit layer located at a side of the second driving electrode layer away from the receiving electrode layer; and a plurality of connection electrodes; the driving circuit layer includes a plurality of driving units, each of the plurality of second driving electrodes includes a plurality of through holes, the plurality of connection electrodes pass through the plurality of through holes, respectively, to electrically connect the plurality of receiving electrodes with the plurality of driving units, respectively, and the plurality of connection electrodes are insulated from the plurality of second driving electrodes.

For example, in the fingerprint identification module provided by an embodiment of the present disclosure, each of the driving units includes a thin film transistor.

For example, in the fingerprint identification module provided by an embodiment of the present disclosure, the fingerprint identification module further includes: an auxiliary structure located at a side of the receiving electrode layer close to the piezoelectric material layer; each of the plurality of first driving electrodes extends in the first direction and beyond a first edge of the piezoelectric material layer in the first direction, the plurality of first driving electrodes are arranged at intervals in the second direction, the auxiliary structure is arranged to be at least in contact with the first edge, the auxiliary structure includes a slope portion, a thickness of the slope portion gradually decreases in a direction from the first edge to a position away from a center of the piezoelectric material layer.

For example, in the fingerprint identification module provided by an embodiment of the present disclosure, a slope angle of the slope portion is less than 60 degrees.

For example, in the fingerprint identification module provided by an embodiment of the present disclosure, the auxiliary structure includes: a main body portion arranged in the same layer as the piezoelectric material layer; and an overlap portion connected with the main body portion and located at a side of the first edge of the piezoelectric material layer away from the functional substrate.

For example, in the fingerprint identification module provided by an embodiment of the present disclosure, the auxiliary structure is arranged along edges of the piezoelectric material, and the auxiliary structure is also in contact with a second edge of the piezoelectric material layer in the second direction. For example, in the fingerprint identification module provided by an embodiment of the present disclosure, the fingerprint identification module further includes: an acoustic wave reflection layer located at a side of the plurality of first driving electrode layers away from the piezoelectric material layer; and an insulation layer located between the acoustic wave reflection layer and the plurality of first driving electrode layers.

For example, in the fingerprint identification module provided by an embodiment of the present disclosure, a material of the piezoelectric material layer includes polyvinylidene fluoride.

At least one embodiment of the present disclosure further provides an electronic device including any one of the fingerprint identification modules as described above.

At least one embodiment of the present disclosure further provides a driving method of a fingerprint identification module, which includes: applying a driving voltage to the driving electrode pair to drive the piezoelectric material layer corresponding to the driving electrode to transmit ultrasonic waves; and receiving, by using the piezoelectric material layer, the ultrasonic waves reflected by a fingerprint and outputting a corresponding fingerprint electrical signal through the receiving electrode.

For example, in the driving method of the fingerprint identification module provided by an embodiment of the present disclosure, applying the driving voltage to the driving electrode pair to drive the piezoelectric material layer corresponding to the driving electrode to transmit the ultrasonic waves includes: applying a first driving voltage to the first driving electrode in the driving electrode pair; and applying a second driving voltage to the second driving electrode in the driving electrode pair; a polarity of the first driving voltage is opposite to a polarity of the second driving voltage.

For example, in the driving method of the fingerprint identification module provided by an embodiment of the present disclosure, an absolute value of the first driving voltage and an absolute value of the second driving voltage are the same.

For example, in the driving method of the fingerprint identification module provided by an embodiment of the present disclosure, at the first moment, the first driving voltage is a positive voltage, and the second driving voltage is a negative voltage; at the second moment, the first driving voltage is a negative voltage, and the second driving voltage is a positive voltage.

BRIEF DESCRIPTION OF THE DRAWINGS

In order to clearly illustrate the technical solutions of the embodiments of the present disclosure, the drawings of the embodiments will be briefly described in the following; it is obvious that the described drawings below are only related to some embodiments of the present disclosure and thus are not limitative to the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

Figure 1:
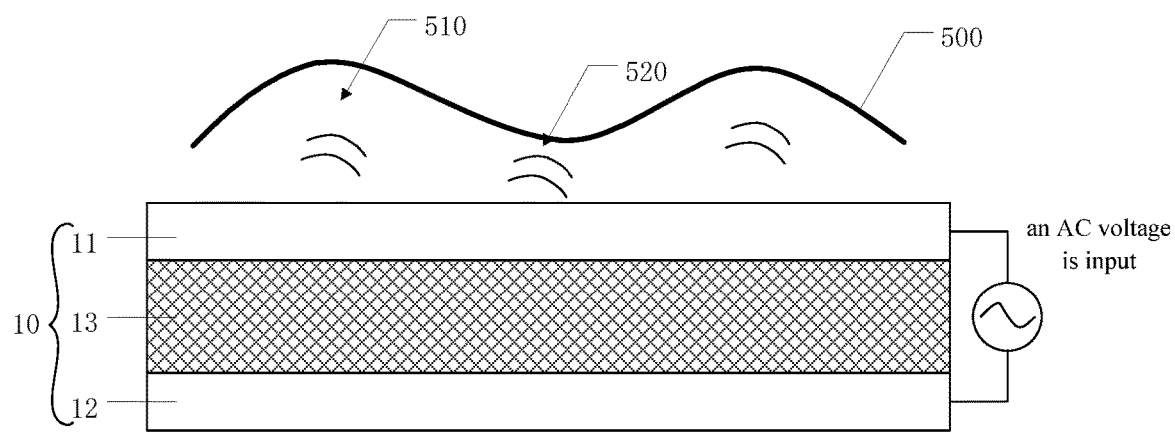
FIG. 1 is a schematic diagram of a fingerprint identification module transmitting ultrasonic waves.
Figure 2:
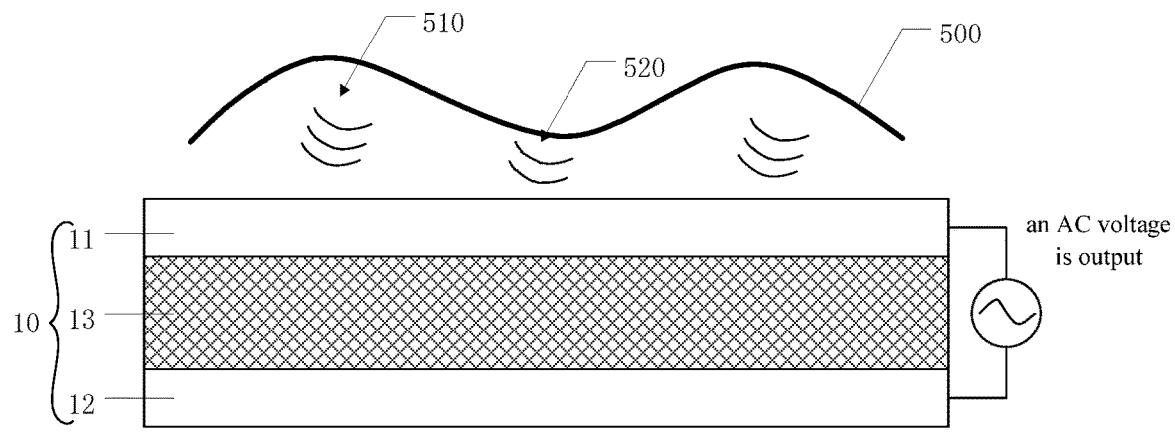
FIG. 2 is a schematic diagram of a fingerprint identification module receiving ultrasonic waves.

FIG. 1 is a schematic diagram of a fingerprint identification module transmitting ultrasonic waves; FIG. 2 is a schematic diagram of a fingerprint identification module receiving ultrasonic waves. As illustrated in FIG. 1, the fingerprint identification module includes an ultrasonic sensor 10; the ultrasonic sensor 10 includes an upper electrode 11, a lower electrode 12, and a piezoelectric layer 13 between the upper electrode 11 and the lower electrode 12; the piezoelectric layer 13 is made of a piezoelectric material, and can be excited by voltage to produce a reverse piezoelectric effect. As illustrated in FIG. 1, when an alternating voltage (AC voltage) is input between the upper electrode 11 and the lower electrode 12 (for example, the upper electrode 11 is grounded and an alternating square wave is applied to the lower electrode 12), the piezoelectric layer 13 will deform or drive the film layers above and below the piezoelectric layer 13 to vibrate together due to the inverse piezoelectric effect, so that the ultrasonic wave can be generated and transmitted outward. It should be explained that in the case where a chamber (such as an air chamber) is arranged at a side of the upper electrode 11 away from the piezoelectric layer 13 or at a side of the lower electrode 12 away from the piezoelectric layer 13, the ultrasonic wave transmitted by the ultrasonic sensor are strengthened. Therefore, the ultrasonic wave can be transmitted better.

As illustrated in FIG. 2, the ultrasonic wave transmitted by the ultrasonic sensor 10 is reflected by the fingerprint 500, and the ultrasonic wave reflected back will be converted into an alternating voltage in the piezoelectric layer; at this time, the upper electrode 11 is grounded, and the lower electrode 12 can be used as a receiving electrode to receive the alternating voltage generated by the piezoelectric layer. Because the fingerprint 500 includes valleys 510 and ridges 520 that have different reflection capabilities for ultrasonic wave (valley 510 has a strong ability to reflect the ultrasonic wave), resulting in different intensities of the ultrasonic wave reflected back by valleys 510 and ridges 520. Therefore, whether the ultrasonic wave is the ultrasonic wave reflected by the valley or the ridge can be determined by the alternating voltage received by the receiving electrode.

Figure 3:
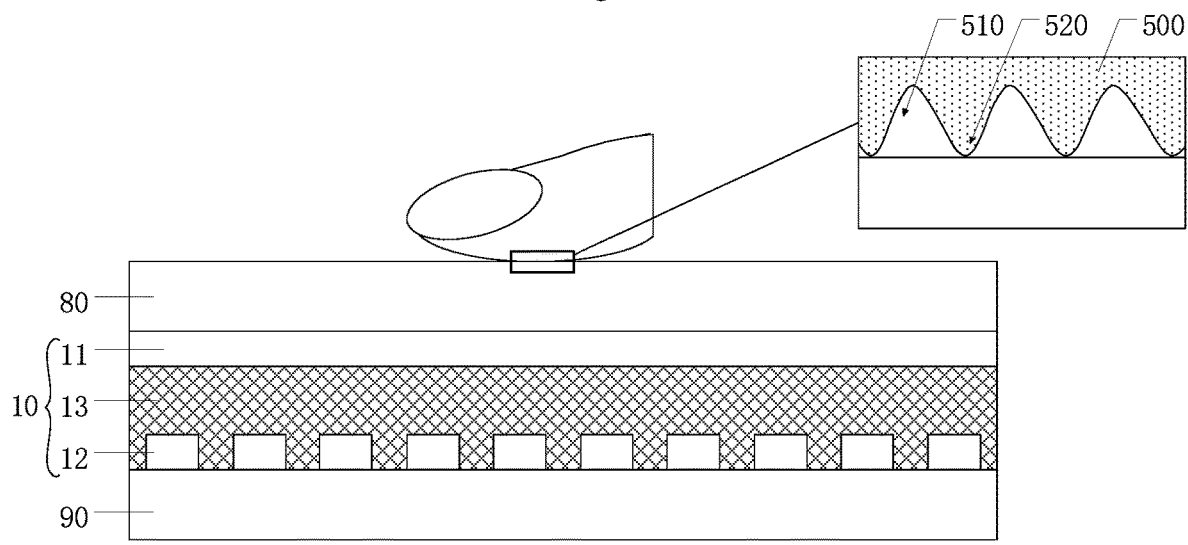
FIG. 3 is a schematic diagram of a fingerprint identification module that performs fingerprint identification.

FIG. 3 is a schematic diagram of a fingerprint identification module that performs fingerprint identification. As illustrated in FIG. 3, the fingerprint identification module includes an upper electrode 11, a plurality of lower electrodes 12, a piezoelectric layer 13 located between the upper electrode 11 and the plurality of lower electrodes 12, a substrate 80 located at a side of the upper electrode 11 away from the piezoelectric layer 13 and a protective layer 90 located at a side of the plurality of lower electrodes 12 away from the piezoelectric layer 13. The ultrasonic sensor 10 composed of the lower electrode 12, the piezoelectric layer 13 and the plurality of upper electrodes 11 can transmit an ultrasonic wave and can also receive ultrasonic waves. That is to say, the ultrasonic sensor 10 serves as both an ultrasonic transmission sensor and an ultrasonic reception sensor. When the fingerprint is in contact with the substrate 80, the ultrasonic wave transmitted by the ultrasonic sensor 10 is reflected by the fingerprint 500, and the ultrasonic wave reflected back will be converted into an alternating voltage in the piezoelectric layer; at this time, the upper electrode 11 is grounded, the plurality of lower electrodes 12 serve as receiving electrodes, the alternating voltage generated by the piezoelectric layer can be received at different positions. Because the fingerprint 500 includes valleys 510 and ridges 520 that have different reflection capabilities for ultrasonic waves (valley 510 has a strong ability to reflect ultrasonic wave), resulting in different intensities of ultrasonic waves reflected back by valleys 510 and ridges 520. Therefore, the position information of valleys and ridges in the fingerprint 500 can be obtained through the alternating voltages received by the plurality of lower electrodes 12, so that fingerprint identification can be realized.

In the research, the inventor of the present application found that, in order to achieve better ultrasonic fingerprint identification effect, the fingerprint identification module needs to use ultrasonic focusing technology. That is, the plurality of ultrasonic sensors in the fingerprint identification module are separately driven and ultrasonic waves generated by different ultrasonic sensors have a certain phase difference, so that the ultrasonic waves are focused (constructive interference) at a target position. That is, the intensity or energy of the ultrasonic wave at the target position is enhanced; on the other hand, the usual piezoelectric layer (such as PVDF) needs to be driven or excited by a high-voltage; however, it is difficult to be driven or excited by a high-voltage for the plurality of ultrasonic sensors, that is, it is difficult to achieve high-voltage multi-channels. In view of this, a structure of the fingerprint identification module is adjusted by the inventor of the present application to achieve high-voltage drive or high-voltage excitation of the piezoelectric layer at a lower voltage, thereby achieving a better fingerprint identification effect.

In this regard, the embodiments of the present disclosure provide a fingerprint identification module, a driving method thereof, and an electronic device. The fingerprint identification module includes a receiving electrode layer, a piezoelectric material layer, a first driving electrode layer and a second driving electrode layer. The receiving electrode layer includes a plurality of receiving electrodes; the piezoelectric material layer is arranged at a side of the receiving electrode layer; the first driving electrode layer is arranged at a side of the piezoelectric material layer away from the receiving electrode layer and includes a plurality of first driving electrodes; the second driving electrode layers are arranged at a side of the receiving electrode layer away from the piezoelectric material layer and include a plurality of second driving electrodes, the plurality of first driving electrodes and the plurality of second driving electrodes form a plurality of driving electrode pairs, in each of the plurality of driving electrode pairs, an orthographic projection of the first driving electrode on the piezoelectric material layer is at least partially overlapped with an orthographic projection of the second driving electrode on the piezoelectric material layer. With this arrangement, the first driving electrode and the second driving electrode in each driving electrode pair together with the piezoelectric material layer can constitute an ultrasonic transmitting element, so that ultrasonic transmission can be realized. In addition, the fingerprint identification module can also apply a first driving voltage to the first driving electrode and apply a second driving voltage with a polarity opposite to a polarity of the first driving voltage to the second driving electrode, thereby realizing high-voltage drive or high-voltage excitation of the piezoelectric material layer with a lower driving voltage. Thus, on the one hand, the fingerprint identification module can greatly reduce the risk of breakdown of electronic components (such as thin film transistors) in the driving unit due to high voltage, thereby improving the stability and durability of the product, and on the other hand, the fingerprint identification module can simultaneously realize high-voltage drive or high-voltage excitation of the piezoelectric material layer and ultrasonic focusing technology, thereby facilitating to improve fingerprint identification performance and realize a large-sized fingerprint identification module.

Hereinafter, the fingerprint identification module, the driving method of the fingerprint identification module, and the electronic device provided by the embodiments of the present disclosure will be described in detail with reference to the drawings.

Figure 4:
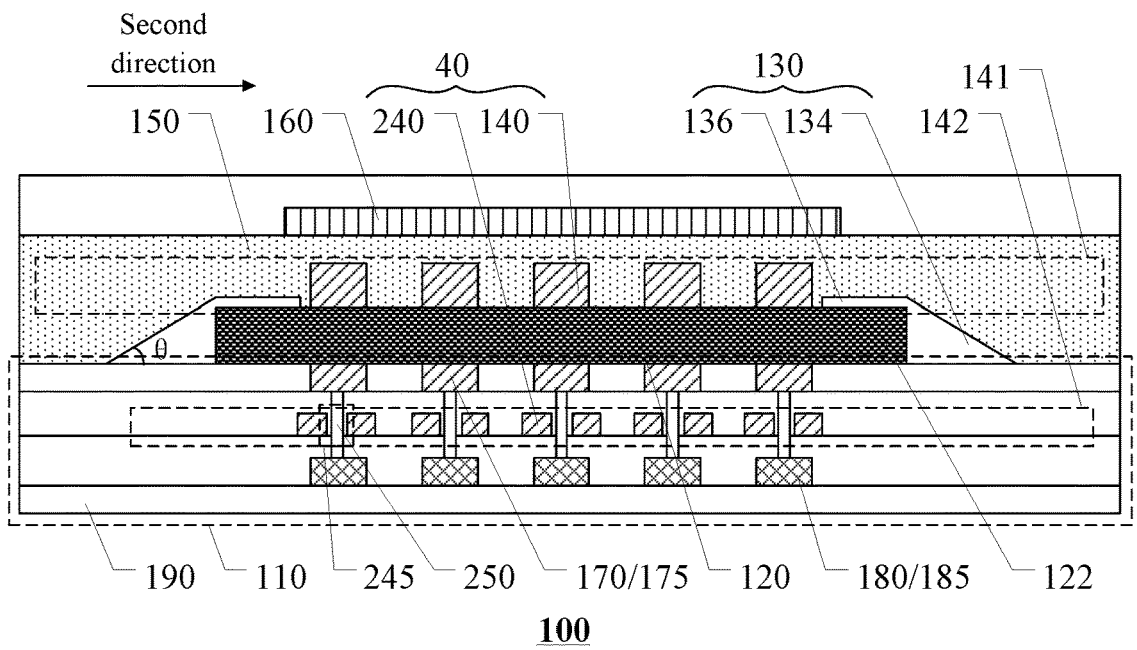
FIG. 4 is a schematic cross-sectional view, in a second direction, of a fingerprint identification module provided by an embodiment of the present disclosure.
Figure 5:
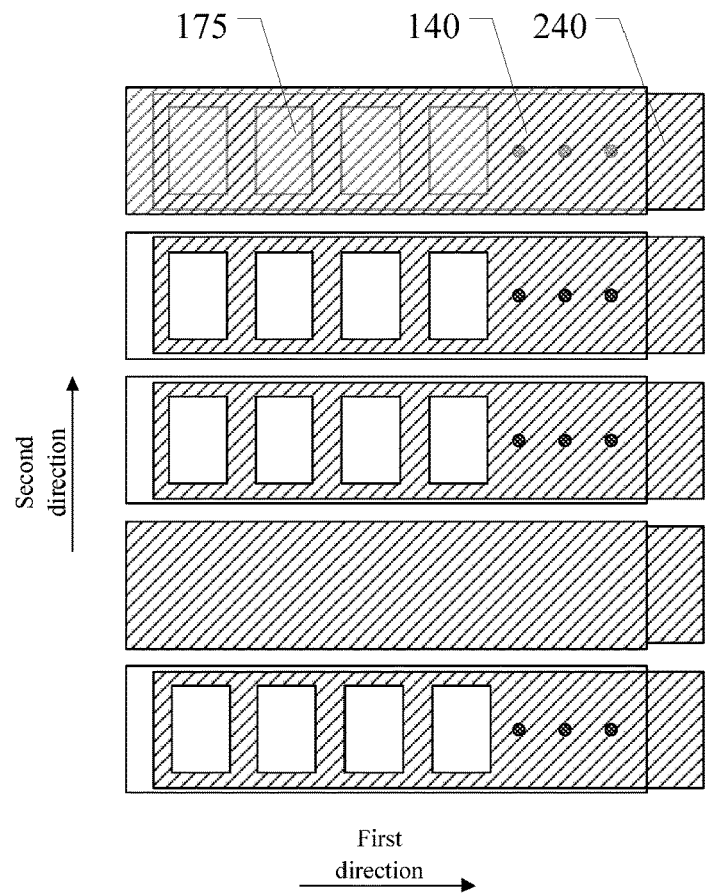
FIG. 5 is a schematic diagram of a positional relationship between a driving electrode and a receiving electrode of another fingerprint identification module provided by an embodiment of the present disclosure.

An embodiment of the present disclosure provides a fingerprint identification module. FIG. 4 is a schematic cross-sectional view, in a second direction, of a fingerprint identification module provided by an embodiment of the present disclosure; FIG. 5 is a positional relationship between a driving electrode and a receiving electrode of another fingerprint identification module provided by an embodiment of the present disclosure. As illustrated in FIG. 4 and FIG. 5, the fingerprint identification module includes a receiving electrode layer 170, a piezoelectric material layer 120, a first driving electrode layer 141 and a second driving electrode layer 142. The receiving electrode layer 170 includes a plurality of receiving electrodes 175; the piezoelectric material layer 120 is arranged at a side of the receiving electrode layer 170; the first driving electrode layer 141 is arranged at a side of the piezoelectric material layer 120 away from the receiving electrode layer 170 and includes a plurality of first driving electrodes 140; the second driving electrode layer 142 is arranged at a side of the receiving electrode layer 170 away from the piezoelectric material layer 120 and includes a plurality of second driving electrodes 240, the plurality of first driving electrodes 140 and the plurality of second driving electrodes 240 form a plurality of driving electrode pairs 40, and, in each of the plurality of driving electrode pairs 40, an orthographic projection of the first driving electrode 140 on the piezoelectric material layer 120 is at least partially overlapped with an orthographic projection of the second driving electrode 240 on the piezoelectric material layer 120.

In the fingerprint identification module provided by the embodiment of the present disclosure, the first driving electrode and the second driving electrode in each driving electrode pair together with the piezoelectric material layer may constitute an ultrasonic wave transmitting element, so as to achieving transmitting an ultrasonic wave. In addition, the fingerprint identification module can also apply a first driving voltage to the first driving electrode and apply a second driving voltage with a polarity opposite to a polarity of the first driving voltage to the second driving electrode, thereby achieving high-voltage drive or high-voltage excitation of the piezoelectric material layer with a lower driving voltage (absolute value). For example, the first driving voltage can be +50V, and the second driving voltage can be −50V, so that a voltage difference of 100V can be formed on both sides of the piezoelectric material layer, and high voltage drive or high voltage excitation (100V) of the piezoelectric material layer can be realized with a lower driving voltage (50V). Thus, on the one hand, the fingerprint identification module can greatly reduce the risk of breakdown of electronic components (such as thin film transistors) in the driving unit due to high voltage, thereby improving the stability and durability of the product, and on the other hand, the fingerprint identification module can simultaneously realize high-voltage drive or high-voltage excitation of the piezoelectric material layer and ultrasonic focusing technology, thereby facilitating to improve fingerprint identification performance and realize a large-sized fingerprint identification module. It should be explained that, because the receiving electrode is electrically connected with the driving unit, the driving voltage cannot be directly applied to the receiving electrode, the fingerprint identification module provided by this exemplary embodiment is cleverly provided with a plurality of second driving electrodes to form a plurality of driving electrode pairs with a plurality of first driving electrodes to realize high-voltage drive or high-voltage excitation of the piezoelectric material layer with a low driving voltage (absolute value).

In addition, because the plurality of first driving electrodes and the plurality of second driving electrodes form a plurality of driving electrode pairs, the plurality of first driving electrodes arranged on the piezoelectric material layer, the piezoelectric material layer and the plurality of second driving electrodes may constitute a plurality of ultrasonic wave transmitting element; the plurality of receiving electrodes, the piezoelectric material layer and the plurality of first driving electrodes may constitute a plurality of ultrasonic wave receiving elements. When the fingerprint identification module performs fingerprint identification, alternating voltages of opposite polarities can be applied to the first driving electrode and the second driving electrode in each driving electrode pair, respectively, and the piezoelectric material layer may deform due to the reverse piezoelectric effect or drive the film layers above and below the piezoelectric material layer to vibrate together, so that an ultrasonic wave can be generated and transmitted outward. The fingerprint identification module can realize the focusing of ultrasonic waves by separately driving the plurality of ultrasonic wave transmitting element mentioned above, on the one hand, the focusing of ultrasonic waves can increase the intensity or energy of the transmitted ultrasonic waves in a specific area or specific direction, thereby improving the fingerprint identification performance, on the other hand, the focusing of ultrasonic waves can make the transmitted ultrasonic wave have better directivity, which can reduce the crosstalk between the valleys and ridges of the fingerprint, thereby improving the fingerprint identification performance. When the transmitted ultrasonic waves are reflected by the fingerprint back to the fingerprint identification module, the plurality of ultrasonic wave receiving elements corresponding to the plurality of receiving electrodes can receive the reflected ultrasonic waves and convert the ultrasonic signals into electrical signals, thereby realizing fingerprint identification. In addition, when the fingerprint identification module improves the intensity or energy of the transmitted ultrasonic waves in a specific area or in a specific direction by realizing the focusing of the ultrasonic waves, the fingerprint identification module can not only realize fingerprint identification, but also penetrate the finger to distinguish whether the fingerprint is true skin.

In some exemplary embodiments, as illustrated in FIG. 4 and FIG. 5, the plurality of receiving electrodes 175 are arrayed in a first direction and in a second direction, the plurality of first driving electrodes 140 are arranged in the second direction, and the second driving electrodes 240 are arranged in the second direction, each first driving electrode 140 and each second driving electrode 240 are strip electrodes extending in the first direction, and the first direction intersects with the second direction. With this arrangement, the fingerprint identification module can realize the focusing of the ultrasonic waves in the second direction by driving the above-mentioned first driving electrodes and the second driving electrodes, respectively.

For example, as illustrated in FIG. 4 and FIG. 5, the first direction and the second direction are perpendicular to each other.

In some exemplary embodiments, as illustrated in FIG. 4 and FIG. 5, an orthographic projection of each second driving electrode 240 on the piezoelectric material layer 120 is at least partially overlapped with an orthographic projection of the receiving electrodes 175 arranged in the first direction on the piezoelectric material layer 120. That is to say, the orthographic projection of each first driving electrode on the piezoelectric material layer and the orthographic projection of each second driving electrodes on the piezoelectric material layer are both at least partially overlapped with the orthographic projection of multiple receiving electrodes arranged in the first direction on the piezoelectric material layer, thereby facilitating the formation of the plurality of ultrasonic wave receiving elements.

In some exemplary embodiments, as illustrated in FIG. 4 and FIG. 5, the fingerprint identification module 100 further includes a driving circuit layer 180 and a plurality of connection electrodes 250; the driving circuit layer 180 is located at a side of the second driving electrode layer 142 away from the receiving electrode layer 170, the driving circuit layer 180 includes a plurality of driving units 185; each second driving electrode 240 includes a plurality of through holes 245, and a plurality of connection electrodes 250 pass through the plurality of through holes 245, respectively, so as to electrically connect the plurality of receiving electrodes 175 with the driving units 185, respectively, and the plurality of connection electrodes 175 are insulated from the second driving electrode 240. In this way, the fingerprint identification module can realize the electrical connection between the receiving electrode and the driving unit, and the receiving electrode can be arranged closer to the piezoelectric material layer (for example, the receiving electrode can be arranged to be in contact with the piezoelectric material layer), so that can better receive the electrical signal generated by the piezoelectric material layer caused by receiving ultrasonic waves, and the accuracy of fingerprint identification can be improved.

In some exemplary embodiments, as illustrated in FIG. 4 and FIG. 5, each driving unit 185 includes a thin film transistor. For example, each driving unit 185 may include a driving circuit composed of a storage capacitor, a thin film transistor, and other electronic components, so as to realize functions such as reading and amplifying electrical signals received by the receiving electrodes. In addition, the fingerprint identification module can realize high-voltage drive or high-voltage excitation of the piezoelectric material layer with a low driving voltage, thereby greatly reducing the risk of breakdown of thin-film transistors in the driving unit due to high voltage, thereby improving the stability and durability of the product.

Figure 6:
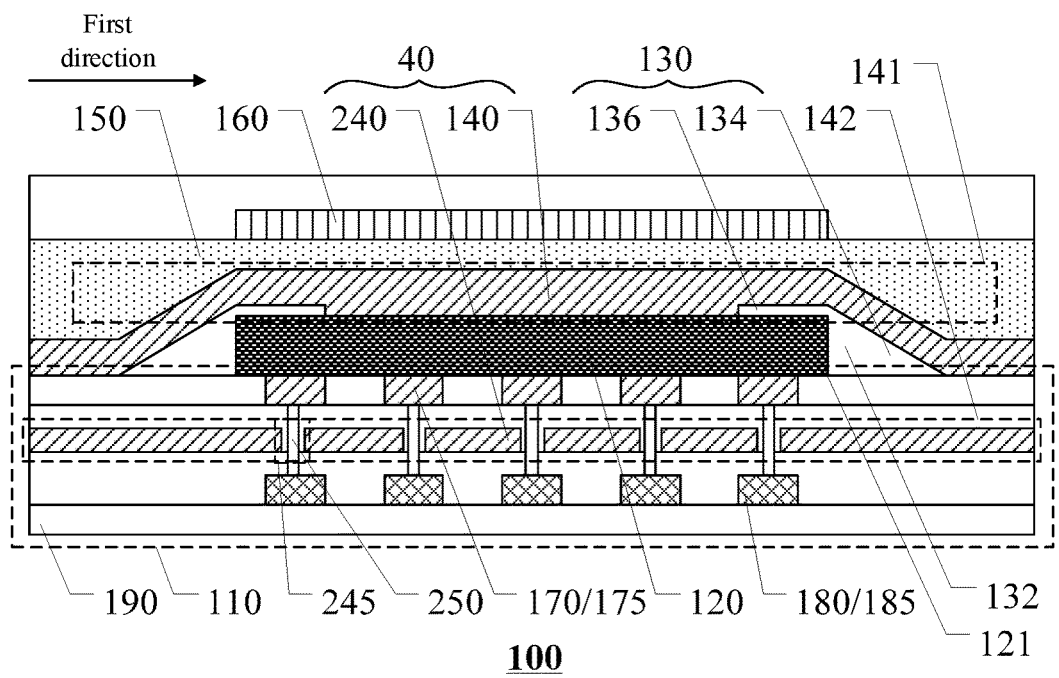
FIG. 6 is a schematic cross-sectional view, in a first direction, of a fingerprint identification module provided by an embodiment of the present disclosure.

FIG. 6 is a schematic cross-sectional view, in a first direction, of a fingerprint identification module provided by an embodiment of the present disclosure. As illustrated in FIG. 4 and FIG. 6, the fingerprint identification module 100 further includes an auxiliary structure 130 located at a side of the receiving electrode layer 170 close to the piezoelectric material layer 120; each first driving electrode 140 extends in the first direction and beyond a first edge 121 of the piezoelectric material layer 120 in the first direction, that is, each first driving electrode 140 goes beyond the first edge 121 of the piezoelectric material layer 120 in the first direction; the plurality of first driving electrodes 140 are arranged at intervals in the second direction, and the plurality of first driving electrodes 140 are insulated from each other; the auxiliary structure 130 is arranged at least in contact with the first edge 121 and includes a slope portion 132; a thickness of the slope portion 132 gradually decreases in a direction from the first edge 121 to a position away from a center of the piezoelectric material layer 120. It should be explained that the first edge of the piezoelectric material layer in the first direction refers to that an extension direction of the first edge intersects with the first direction, and the extension direction of the first edge is not parallel with the first direction.

In the fingerprint identification module provided by this exemplary embodiment, because the auxiliary structure is arranged to be in contact with at least the first edge, the first driving electrode extending in the first direction and beyond the first edge extends from the piezoelectric material layer to the auxiliary structure rather than directly extends from the piezoelectric material layer to the functional substrate; in addition, the auxiliary structure includes a slope portion, and a thickness of the slope portion gradually decreases in a direction from the first edge to a position away from a center of the piezoelectric material layer. Therefore, in the process of forming the plurality of first driving electrodes on the piezoelectric material layer, the photoresist can be sufficiently exposed and developed at the first edge, thereby effectively avoiding the disconnection of a conductive layer in the subsequent etching process, and the problem of residual conductive material can also be avoided, thereby avoiding electrical connection of two adjacent first driving electrodes, thereby improving the yield of the product.

In some exemplary embodiments, as illustrated in FIG. 4 and FIG. 6, a slope angle of the slope portion 132 is less than 60 degrees. With this arrangement, problems such as disconnection and conductive material residue during the formation of the plurality of first driving electrodes can be better avoided.

In some exemplary embodiments, as illustrated in FIG. 4 and FIG. 6, the auxiliary structure 130 includes a main body portion 134 and an overlap portion 136; the main body portion 134 is located on the functional substrate 110 and is disposed in the same layer as the piezoelectric material layer 120; the overlap portion 136 is connected with the main body portion 134 and is located at a side of the first edge 121 of the piezoelectric material layer 120 away from the functional substrate 110. With this arrangement, the auxiliary structure not only avoids problems such as disconnection and conductive material residue during the formation of the first driving electrode, but also can fix the piezoelectric material layer on the functional substrate through the overlap portion, thereby preventing the piezoelectric material layer from falling off during production and use. In some exemplary embodiments, a material of the piezoelectric material layer includes polyvinylidene fluoride (PVDF). Because polyvinylidene fluoride is a fluorine-containing material, it has poor adhesion to the receiving electrode layer (the receiving electrode layer further includes a silicon nitride layer located between the receiving electrodes), causing the piezoelectric material layer to easily fall off. Therefore, by providing the above-mentioned overlap portion, the fingerprint identification module can effectively prevent the piezoelectric material layer from falling off during the manufacturing and use processes. On the other hand, in the process of stripping off the photoresist pattern (PR), the components of the stripping solution of the photoresist pattern usually include N-methylformamide (NMF) and diethylene glycol monomethyl ether, while polyvinylidene fluoride is dissolved in N-methylformamide and ethers. Therefore, on the one hand, the above-mentioned auxiliary structure can protect the edges of the piezoelectric material layer in the process of stripping the photoresist pattern (PR) to prevent the stripping liquid of the photoresist pattern from corroding the piezoelectric material layer, thereby avoiding the piezoelectric material layer falling off; on the other hand, the overlap portion of the above-mentioned auxiliary structure can fix the piezoelectric material layer on the functional substrate, thereby further preventing the piezoelectric material layer from falling off during manufacturing and use.

For example, as illustrated in FIG. 4 and FIG. 6, the main body portion 134 includes the above-described slope portion 132. That is, the slope portion 132 is a part of the main body portion 134.

In some exemplary embodiments, a size of the overlap portion 136 in the first direction is greater than 200 microns. According to experimental results, in the case where the size of the overlap portion in the first direction is greater than 200 μm, the auxiliary structure can effectively prevent the piezoelectric material layer from falling off during manufacturing and use. For example, the size of the overlap portion in the first direction may be 400, 600, 800, 1000, or 1500 microns.

In some exemplary embodiments, a material of the auxiliary structure includes curable glue. Therefore, in the process of forming the auxiliary structure, after applying a curable glue and before curing to form the auxiliary structure, due to a certain fluidity or ductility, the curable glue will undergo a leveling process, thereby naturally forming the above-mentioned slope portion, so that no additional process steps are required, which can reduce manufacturing difficulty and cost.

In some exemplary embodiments, a material of the auxiliary structure includes optical curable glue (OC glue). Therefore, the auxiliary structure can be directly patterned through an exposure process without using a mask process, thereby further reducing the manufacturing cost.

In some exemplary embodiments, as illustrated in FIG. 4 and FIG. 6, the fingerprint identification module 100 further includes an insulation layer 150 and an acoustic wave reflection layer 160; the insulation layer 150 is located at a side of the plurality of first driving electrodes 140 away from the functional substrate 110. The acoustic wave reflection layer 160 is located at the side of the insulation layer 150 away from the plurality of first driving electrodes 140. An orthographic projection of the acoustic wave reflection layer 160 on the functional substrate 110 is overlapped with an orthographic projection of the piezoelectric material layer 120 on the functional substrate 110. In this way, the acoustic wave reflection layer 160 can reflect the ultrasonic waves generated by the piezoelectric material layer 120 and propagating toward the acoustic wave reflection layer 160 to the position where the functional substrate 110 is located, thereby facilitating to enhance the intensity or energy of the transmitted ultrasonic waves.

For example, the acoustic wave reflection layer 160 may be made of silver (Ag), and the insulation layer 150 may be made of silicon nitride (SiNx). Of course, the embodiments of the present disclosure include but are not limited thereto, the acoustic wave reflection layer may also be made of other materials with characteristics of reflecting ultrasonic waves, and the insulation layer may also be made of other insulation materials such as resin.

In some exemplary embodiments, as illustrated in FIG. 4 and FIG. 6, the fingerprint identification module 100 further includes a substrate 190 located at a side of the driving circuit layer 180 away from the piezoelectric material layer 120. The substrate 190 may include a contact surface configured to contact with the fingerprint. When the fingerprint is in contact with the contact surface, the fingerprint identification module 100 can identify the fingerprint by transmitting ultrasonic waves to the fingerprint and receiving ultrasonic waves (waves reflected back) reflected by the fingerprint. Of course, the embodiments of the present disclosure include but are not limited thereto. When the fingerprint identification module is used in a display device, the substrate may be a cover of the display device.

In some exemplary embodiments, the substrate 190 includes a glass substrate.

In some exemplary embodiments, the substrate 190 includes a polyimide substrate. Thus, the substrate 190 can be made thinner, and a thickness of the substrate 190 is in a range from 5 to 20 microns. It should be explained that when the substrate 190 is a polyimide substrate, a polyimide layer may be formed on a glass substrate, and then structures such as a receiving electrode layer, a piezoelectric material layer, and a first driving electrode may be formed on the polyimide layer, and finally the glass substrate is removed to obtain the fingerprint identification module described in this exemplary embodiment.

Figure 7:
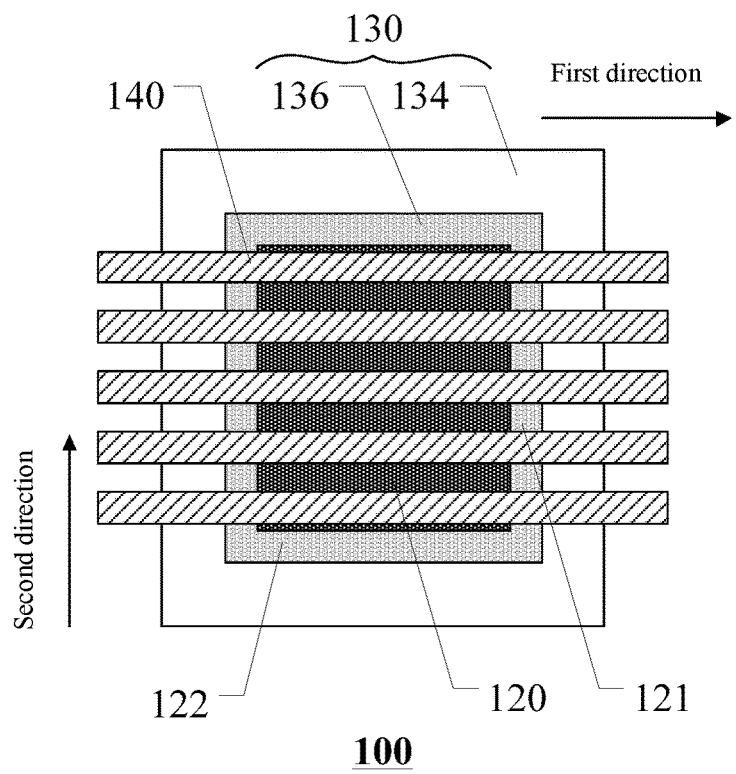
FIG. 7 is a schematic diagram of a planar relationship between an auxiliary electrode and a piezoelectric material layer of a fingerprint identification module provided by an embodiment of the present disclosure.

FIG. 7 is a schematic diagram illustrating a planar relationship between an auxiliary structure and a piezoelectric material layer of a fingerprint identification module provided by an embodiment of the present disclosure. As illustrated in FIG. 7, the auxiliary structure 130 is arranged along edges of the piezoelectric material 120, and the auxiliary structure 130 is also in contact with a second edge 122 of the piezoelectric material layer 120 in the second direction. With this arrangement, the auxiliary structure can protect the edges of the piezoelectric material layer in all directions during the process of stripping the photoresist pattern (PR), to better prevent the stripping liquid of the photoresist pattern from corroding the piezoelectric material layer, thereby better avoiding falling off of the piezoelectric material layer. Of course, the embodiments of the present disclosure include but are not limited thereto, and the auxiliary structure may also be provided only at the first edge of the piezoelectric material in the first direction. It should be explained that the second edge of the piezoelectric material layer in the second direction refers to that an extension direction of the second edge intersects with the second direction, and the extension direction of the second edge is not parallel with the second direction.

For example, as illustrated in FIG. 7, a shape of the orthographic projection of the piezoelectric material layer 120 on the functional substrate 110 may include a rectangle, such as a square. The auxiliary structure 130 is arranged along the four edges of the piezoelectric material layer 120. Of course, the embodiments of the present disclosure include but are not limited thereto, the shape of the piezoelectric material layer may be set according to actual needs;

and the auxiliary structure may also be provided only at the first edge of the piezoelectric material layer in the first direction.

Figure 8:
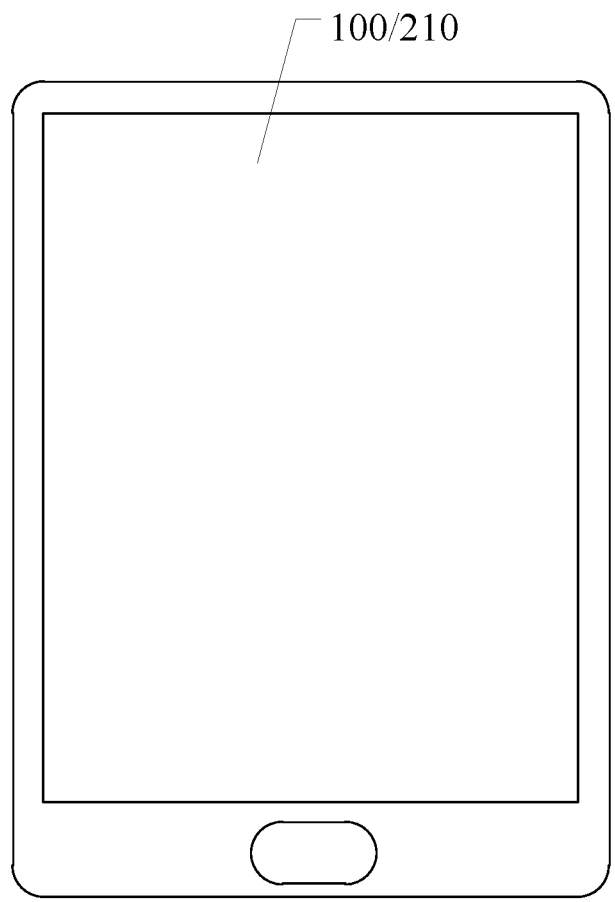
FIG. 8 is a schematic structural diagram of an electronic device provided by an embodiment of the present disclosure.

An embodiment of the present disclosure also provides an electronic device. FIG. 8 is a schematic structural diagram of an electronic device provided by an embodiment of the present disclosure. As illustrated in FIG. 8, the electronic device 300 includes the fingerprint identification module 100 described above. Thus, the electronic device can realize the fingerprint identification function. In addition, because the fingerprint identification module can achieve high-voltage drive or high-voltage excitation of the piezoelectric material layer with a low driving voltage (absolute value), the electronic device can greatly reduce the risk of breakdown of electronic components (such as thin film transistors) caused by high voltage), thereby improving the stability and durability of the product, and also facilitating the realization of large-size fingerprint identification modules.

In some exemplary embodiments, the electronic device can also effectively avoid the problem of disconnection and conductive material residue during the etching process, thus the electronic device has better yield and performance. For details, please refer to the relevant description about the fingerprint identification module, without particularly repeated here.

For example, in some exemplary embodiments, as illustrated in FIG. 8, the display device 300 further includes a display module 310. An area of the display module 310 is approximately the same as an area of the fingerprint identification module 100, so that full-screen fingerprint identification can be achieved. In this case, the fingerprint identification module can also realize a touch function, so that an additional touch device, such as a capacitive touch panel, can be omitted, thereby reducing the cost of the display device. Of course, the embodiments of the present disclosure include but are not limited thereto, the area of the display module may not be equal to the area of the fingerprint identification module, and the fingerprint identification module may only be set in a region where fingerprint identification is required.

In some exemplary embodiments, the electronic device may be a display device. For example, the display device may be a television, a mobile phone, a computer, a notebook computer, an electronic album, a navigator, and other electronic devices with a display function.

An embodiment of the present disclosure further provides a driving method of a fingerprint identification module. The driving method includes the following steps S801-S802.

Step S801: applying a driving voltage to the driving electrode pair to drive the piezoelectric material layer corresponding to the driving electrode pair to transmit an ultrasonic wave.

Step S802: receiving, by using the piezoelectric material layer, the ultrasonic wave reflected by the fingerprint, and outputting a corresponding fingerprint electrical signal through the receiving electrode.

In the driving method of the fingerprint identification module provided by the embodiment of the present disclosure, the first driving electrode and the second driving electrode in each driving electrode pair together with the piezoelectric material layer may constitute an ultrasonic transmitting element, the plurality of receiving electrodes, the piezoelectric material layer and the plurality of first driving electrodes may constitute a plurality of ultrasonic wave receiving elements. When the fingerprint identification module performs fingerprint identification, alternating voltages of opposite polarities can be applied to the first driving electrode and the second driving electrode in each driving electrode pair, and the piezoelectric material layer may deform due to the reverse piezoelectric effect or drive the film layers above and below the piezoelectric material layer to vibrate together, so that ultrasonic waves can be generated and transmitted outward; when the transmitted ultrasonic waves are reflected by the fingerprint back to the fingerprint identification module, the plurality of ultrasonic wave receiving elements corresponding to the plurality of receiving electrodes can receive the reflected ultrasonic waves and convert the ultrasonic signals into electrical signals to realize fingerprint identification.

In some exemplary embodiments, applying the driving voltage to the driving electrode pair to drive the piezoelectric material layer corresponding to the driving electrode pair to transmit the ultrasonic wave includes: applying a first driving voltage to the first driving electrode of the driving electrode pair; and applying a second driving voltage to the second driving electrode in the driving electrode pair, and the polarities of the first driving voltage and the second driving voltage are opposite to each other. Thus, the fingerprint identification module can also apply a first driving voltage to the first driving electrode and a second driving voltage with a polarity opposite to a polarity of the first driving voltage to the second driving electrode, thereby achieving high-voltage drive or high-voltage excitation of the piezoelectric material layer with a lower driving voltage (absolute value). For example, the first driving voltage can be +50V, and the second driving voltage can be −50V, so that a voltage difference of 100V can be formed on both sides of the piezoelectric material layer, thereby realizing high voltage drive or high voltage excitation (100V) of the piezoelectric material layer with a lower driving voltage (50V). Therefore, on the one hand, the driving method of the fingerprint identification module can greatly reduce the risk of breakdown of electronic components (such as thin film transistors) in the driving unit due to high voltage, thereby improving the stability and durability of the product. On the other hand, the fingerprint identification module can simultaneously realize high-voltage drive or high-voltage excitation and ultrasonic focusing technology on the piezoelectric material layer, thereby facilitating to improve fingerprint identification performance and realize a large-size fingerprint identification module. It should be explained that, in the transmitting stage where the driving voltage is applied to the driving electrode pair to drive the piezoelectric material layer corresponding to the driving electrode to transmit ultrasonic waves, the receiving electrode may float (be in a floating state); while in a receiving stage, the first driving electrode and the second driving electrode can be both grounded.

In some exemplary embodiments, an absolute value of the first driving voltage and an absolute value of the second driving voltage are the same, so that the driving voltage can be better reduced. For example, when a voltage difference of 100V is required on both sides of the voltage material layer, the first driving voltage may be +50V and the second driving voltage may be −50V, so that the first driving voltage and the second driving voltage may be better reduced.

In some exemplary embodiments, the first driving voltage and the second driving voltage are alternating voltages. At the first moment, the first driving voltage is a positive voltage and the second driving voltage is a negative voltage;

at the second moment, the first driving voltage is a negative voltage and the second driving voltage is a positive voltage.

The following should be explained.

(1) In the drawings of the embodiments of the present disclosure, only the structures related to the embodiments of the present disclosure are involved, and other structures may refer to the common design(s).

(2) In case of no conflict, features in one embodiment or in different embodiments of the present disclosure can be combined.

The above are only specific implementations of the present disclosure, but the protection scope of the present disclosure is not limited thereto. Any variations or substitutions conceivable for one skilled in the art who is familiar with the present technical field should be fallen within the protection scope of the present disclosure. Therefore, the protection scope of the present disclosure should be based on the protection scope of the claims.

What is claimed is:

1. A fingerprint identification module, comprising:
    a receiving electrode layer comprising a plurality of receiving electrodes;
    a piezoelectric material layer arranged at a side of the receiving electrode layer;
    a first driving electrode layer arranged at a side of the piezoelectric material layer away from the receiving electrode layer and comprising a plurality of first driving electrodes; and
    a second driving electrode layer arranged at a side of the receiving electrode layer away from the piezoelectric material layer and comprising a plurality of second driving electrodes,
    wherein the plurality of first driving electrodes and the plurality of second driving electrodes form a plurality of driving electrode pairs, and, in each of the plurality of driving electrode pairs, an orthographic projection of the first driving electrode on the piezoelectric material layer is at least partially overlapped with an orthographic projection of the second driving electrode on the piezoelectric material layer.

2. The fingerprint identification module according to claim 1, wherein the plurality of receiving electrodes are arranged in an array in a first direction and a second direction, and the plurality of first driving electrodes are arranged in the second direction, the plurality of second driving electrodes are arranged in the second direction, each of the plurality of first driving electrodes and each of the plurality of second driving electrodes are strip electrodes extending in the first direction, and the first direction intersects with the second direction.

3. The fingerprint identification module according to claim 2, wherein orthographic projections of each of the plurality of first driving electrodes and each of the plurality of second driving electrodes on the piezoelectric material layer are at least partially overlapped with an orthographic projection of multiple receiving electrodes arranged in the first direction on the piezoelectric material layer.

4. The fingerprint identification module according to claim 3, further comprising:
    a driving circuit layer located at a side of the second driving electrode layer away from the receiving electrode layer; and
    a plurality of connection electrodes,
    wherein the driving circuit layer comprises a plurality of driving units, each of the plurality of second driving electrodes comprises a plurality of through holes, the plurality of connection electrodes pass through the plurality of through holes, respectively, to electrically connect the plurality of receiving electrodes with the plurality of driving units, respectively, and the plurality of connection electrodes are insulated from the plurality of second driving electrodes.

5. The fingerprint identification module according to claim 4, wherein each of the plurality of driving units comprises a thin film transistor.

6. The fingerprint identification module according to claim 2, further comprising:
    an auxiliary structure located at a side of the receiving electrode layer close to the piezoelectric material layer,
    wherein each of the plurality of first driving electrodes extends in the first direction and beyond a first edge of the piezoelectric material layer in the first direction, the plurality of first driving electrodes are arranged at intervals in the second direction, the auxiliary structure is arranged to be at least in contact with the first edge, the auxiliary structure comprises a slope portion, a thickness of the slope portion gradually decreases in a direction from the first edge to a position away from a center of the piezoelectric material layer.

7. The fingerprint identification module according to claim 6, wherein a slope angle of the slope portion is less than 60 degrees.

8. The fingerprint identification module according to claim 6, wherein the auxiliary structure comprises:
    a main body portion arranged in the same layer as the piezoelectric material layer; and
    an overlap portion connected with the main body portion and located at a side of the first edge of the piezoelectric material layer away from the second driving electrode layer.

9. The fingerprint identification module according to claim 6, wherein the auxiliary structure is arranged along edges of the piezoelectric material, and the auxiliary structure is also in contact with a second edge of the piezoelectric material layer in the second direction.

10. The fingerprint identification module according to claim 1, further comprising:
    an acoustic wave reflection layer located at a side of the plurality of first driving electrode layers away from the piezoelectric material layer; and
    an insulation layer located between the acoustic wave reflection layer and the plurality of first driving electrode layers.

11. The fingerprint identification module according to claim 1, wherein a material of the piezoelectric material layer comprises polyvinylidene fluoride.

12. An electronic device comprising the fingerprint identification module according to claim 1.

13. A driving method of a fingerprint identification module according to claim 1, comprising:
    applying a driving voltage to the driving electrode pair to drive the piezoelectric material layer corresponding to the driving electrode pair to transmit an ultrasonic wave; and
    receiving, by using the piezoelectric material layer, the ultrasonic wave reflected by a fingerprint and outputting a corresponding fingerprint electrical signal through the receiving electrode.

14. The driving method of the fingerprint identification module according to claim 13, wherein applying the driving voltage to the driving electrode pair to drive the piezoelectric material layer corresponding to the driving electrode pair to transmit the ultrasonic wave comprises:

applying a first driving voltage to the first driving electrode in the driving electrode pair; and applying a second driving voltage to the second driving electrode in the driving electrode pair, wherein a polarity of the first driving voltage is opposite to a polarity of the second driving voltage.

15. The driving method of the fingerprint identification module according to claim 14, wherein an absolute value of the first driving voltage and an absolute value of the second driving voltage are the same.

16. The driving method of the fingerprint identification module according to claim 14, wherein at the first moment, the first driving voltage is a positive voltage, and the second driving voltage is a negative voltage; at the second moment, the first driving voltage is a negative voltage, and the second driving voltage is a positive voltage.

17. The fingerprint identification module according to claim 3, further comprising:

an auxiliary structure located at a side of the receiving electrode layer close to the piezoelectric material layer, wherein each of the plurality of first driving electrodes extends in the first direction and beyond a first edge of the piezoelectric material layer in the first direction, the plurality of first driving electrodes are arranged at intervals in the second direction, the auxiliary structure is arranged to be at least in contact with the first edge, the auxiliary structure comprises a slope portion, a thickness of the slope portion gradually decreases in a direction from the first edge to a position away from a center of the piezoelectric material layer.

18. The fingerprint identification module according to claim 4, further comprising:

an auxiliary structure located at a side of the receiving electrode layer close to the piezoelectric material layer, wherein each of the plurality of first driving electrodes extends in the first direction and beyond a first edge of the piezoelectric material layer in the first direction, the plurality of first driving electrodes are arranged at intervals in the second direction, the auxiliary structure is arranged to be at least in contact with the first edge, the auxiliary structure comprises a slope portion, a thickness of the slope portion gradually decreases in a direction from the first edge to a position away from a center of the piezoelectric material layer.

* * * * *